(12) United States Patent
Kang et al.

(10) Patent No.: US 8,525,862 B2
(45) Date of Patent: Sep. 3, 2013

(54) LIGHT EMITTING DIODE ARRAY INTEGRATED WITH LENS, LINE PRINTER HEAD, AND METHOD OF MANUFACTURING THE LIGHT EMITTING DIODE ARRAY

(75) Inventors: Seok-jin Kang, Suwon-si (KR); Hyung Choi, Seongnam-si (KR); Eung-yeoul Yoon, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 295 days.

(21) Appl. No.: 12/923,719

(22) Filed: Oct. 5, 2010

(65) Prior Publication Data

US 2011/0097113 A1    Apr. 28, 2011

(30) Foreign Application Priority Data

Oct. 7, 2009    (KR) .................. 10-2009-0095131

(51) Int. Cl.
*B41J 2/45*    (2006.01)
*B41J 27/00*    (2006.01)
*B41J 2/435*    (2006.01)

(52) U.S. Cl.
USPC ............ 347/238; 347/241; 347/242; 347/245

(58) Field of Classification Search
USPC ................... 347/238, 242, 256, 241, 245
See application file for complete search history.

(56) References Cited

U.S. PATENT DOCUMENTS

| | | | |
|---|---|---|---|
| 2006/0097631 A1* | 5/2006 | Lee | 313/504 |
| 2006/0197102 A1* | 9/2006 | Ogihara et al. | 257/99 |
| 2007/0246718 A1* | 10/2007 | Sagimori et al. | 257/88 |
| 2008/0030566 A1* | 2/2008 | Nomura et al. | 347/130 |
| 2009/0147067 A1* | 6/2009 | Seo | 347/244 |
| 2009/0195634 A1* | 8/2009 | Koizumi et al. | 347/238 |
| 2011/0303999 A1* | 12/2011 | Sakamoto et al. | 257/432 |

* cited by examiner

*Primary Examiner* — Stephen Meier
*Assistant Examiner* — Sarah Al Hashimi
(74) *Attorney, Agent, or Firm* — Staas & Halsey LLP

(57) ABSTRACT

A lens integrated light emitting diode array, a line printer head using the light emitting diode array, and a method of manufacturing the light emitting diode array. The light emitting diode array includes a plurality of light emitting diodes formed on a surface of a transparent substrate and a plurality of lenses formed on another surface opposite to the surface of the transparent substrate, wherein the plurality of light emitting diodes are divided into a plurality of groups to be arranged to respectively correspond to the plurality of lenses.

27 Claims, 15 Drawing Sheets

LIGHT EMITTING DIODE ARRAY INTEGRATED WITH LENS, LINE PRINTER HEAD, AND METHOD OF MANUFACTURING THE LIGHT EMITTING DIODE ARRAY

CROSS-REFERENCE TO RELATED APPLICATIONS

This application claims the benefit of Korean Patent Application No. 10-2009-0095131, filed on Oct. 7, 2009, in the Korean Intellectual Property Office, the disclosure of which is incorporated herein in its entirety by reference.

BACKGROUND

1. Field

The present general inventive concept relates to a light emitting diode array integrated with a lens, a line printer head using the light emitting diode array, and a method of manufacturing the light emitting diode array.

2. Description of the Related Art

Light emitting diodes are a PN junction of compound semiconductors that emit light upon receiving a current. Unlike other light sources which use a filament, a light emitting diode does not have the problem of a short circuit caused by oxidization or heating. Also, the light emitting diode is an environmentally friendly device that has a long lifespan and is driven with low power consumption. In addition, the light emitting diode has a high response speed of simultaneously responding to an applied current, has excellent durability against temperature and shocks, and is manufactured in a single-operation semiconductor manufacturing process, and thus may be easily made compact and integrated.

With the commercialization of blue light emitting diodes, natural colors can be realized, and thus a light emitting diode is widely used not only in simple display devices that have been used in the past but also in backlight units (BLU) of mobile phones, flat panel displays, outdoor electric signs, gauge boards for cars, taillights, traffic signals, lightscape lights, etc., and also in the environment field or biotechnology in which water pollution or oxygen density in blood is measured. Furthermore, due to improved product performance and reduced manufacturing costs, the application fields of light emitting diodes has gradually extended, and thus the light emitting diodes are also used as an alternative illumination for home fluorescent lamps.

Recently, as electrophotographic image forming apparatuses have high speed and high image quality, a line printer head (LPH) that uses a light emitting diode as a light source in order to overcome the limits of a laser scanning unit (LSU) which is a conventional exposure apparatus has been developed. The LPH includes thousands of light emitting diodes arranged at intervals of several tens of μm, and each of the light emitting diodes changes light energy according to printing image data to transmit the printing image data to a photosensitive body that is disposed at a distance of several mm away from the light emitting diodes. In a conventional LPH, an optical system, which prevents lights emitted from adjacent light emitting diodes from overlapping, is further included.

SUMMARY

The present general inventive concept provides a light emitting diode array in which a lens for collimating light or focusing light at a far focal point is integrated, and light interference may be prevented, a line printer head including the light emitting diode array, and a method of manufacturing the light emitting diode array.

According to an aspect, there is provided a light emitting diode array including: a transparent substrate including an incident surface and an exit surface; a plurality of light emitting diodes disposed on the incident surface of the transparent substrate; and a plurality of lenses that are disposed on the exit surface of the transparent substrate to magnify light emitted from the plurality of light emitting diodes to form an image, wherein the plurality of light emitting diodes is divided into a plurality of groups, at least two of the plurality of light emitting diodes being arranged in each of the plurality of groups, and the plurality of lenses respectively correspond to the plurality of groups.

The plurality of light emitting diodes may be arranged in a row.

The plurality of light emitting diodes may be arranged in a plurality of rows. The plurality of light emitting diodes of the rows may be arranged in a staggered pattern.

The groups of the plurality of light emitting diodes may be arranged at equivalent distances in a row.

A distance between the adjacent groups of the plurality of light emitting diodes may be larger than a distance between the adjacent light emitting diodes in each of the groups.

The plurality of the lenses may be arranged in a row in the direction of the arrangement of the groups of the plurality of light emitting diodes.

The plurality of the lenses of the plurality of light emitting diodes may be arranged such that spots of light beams emitted from the plurality of light emitting diodes and formed as an image on an image plane are at equivalent distances in the direction of the arrangement of the plurality of light emitting diodes.

An interference prevention unit may be disposed between the adjacent groups of the plurality of light emitting diodes. The interference prevention unit may include a groove formed in the incident surface of the transparent substrate. The groove may be filled with a light absorption material.

A portion of the incident surface of the transparent substrate, except for a bonding area of the plurality of light emitting diodes, may be covered with a reflection layer.

The plurality of light emitting diodes may include compound semiconductors that are grown on a growth substrate and separated from the growth substrate after being grown and that are bonded to the transparent substrate.

Each of the plurality of light emitting diodes may include: a first conductivity compound semiconductor layer that is bonded to the transparent substrate; an active layer formed on the first conductivity compound semiconductor layer; and a second conductivity compound semiconductor layer formed on the active layer.

Each of the plurality of light emitting diodes may include: a first electrode layer formed on a portion of the first conductivity compound semiconductor layer; and a second electrode layer formed on the second conductivity compound semiconductor layer, wherein the second electrode layer further covers a remaining portion of the first conductivity compound semiconductor layer except the portion where the first electrode layer is formed, and an insulation layer is provided beneath the second electrode layer except a portion where the second electrode layer contacts the second conductivity compound semiconductor layer.

A reflection layer may be disposed on the second conductivity compound semiconductor layer.

Each of the plurality of light emitting diodes may have a truncated pyramid shape.

The light emitting diode array may further include a wiring circuit formed on the incident surface of the transparent substrate, wherein the plurality of light emitting diodes are bonded to the wiring circuit by flip-chip bonding.

The plurality of lenses may have refractive power as a surface of the transparent substrate is curved.

The plurality of lenses may be formed of a polymer layer by attaching the polymer layer to the transparent substrate and molding the polymer layer.

The plurality of lenses may have refractive power as impurities have different densities according to positions in the transparent substrate.

According to another aspect, there is provided a line printer head including the above-described light emitting diode array emitting light to a photosensitive body in a main scanning direction.

According to another aspect, there is provided an electrophotographic image forming apparatus including: a photosensitive body; a line printer head for scanning light onto a scanning surface of the photosensitive body to form an electrostatic latent image and includes a light emitting diode array emitting light to the scanning surface of the photosensitive body in a main scanning direction; and a developing unit for supplying toner to the electrostatic latent image formed on the photosensitive body to develop an image.

According to another aspect, there is provided a method of manufacturing a light emitting diode array, the method including: forming a light emitting diode layer on a growth substrate; forming a plurality of lenses on a surface of a transparent substrate; transferring the light emitting diode layer to a surface opposite to the surface of the transparent substrate, according to a plurality of groups respectively corresponding to the plurality of lenses; etching the light emitting diode layer into at least two light emitting diodes for each group; and forming an electrode layer on the etched light emitting diode layer.

According to another aspect, there is provided a method of manufacturing a light emitting diode array, the method including: forming a light emitting diode layer on a growth substrate; transferring the light emitting diode layer to a surface of the transparent substrate, according to a plurality of groups; etching the light emitting diode layer into at least two light emitting diodes for each group; forming an electrode layer on the etched light emitting diode layer; and forming a plurality of lenses on another surface opposite to the surface of the transparent substrate so as to respectively correspond to the plurality of the groups of the light emitting diodes layer.

According to another aspect, there is provided a method of manufacturing a light emitting diode array, the method including: forming a plurality of light emitting diodes on a growth substrate; providing a transparent substrate by forming a plurality of lenses on a surface of a transparent substrate and forming a wiring circuit on another surface opposite to the surface of the transparent substrate; and transferring the plurality of light emitting diodes by bonding the plurality of light emitting diodes formed on the growth substrate to the wiring circuit in a plurality of groups respectively corresponding to the plurality of lenses.

In the transferring, the light emitting diode layer formed on the growth substrate may be bonded to the transparent substrate.

The transferring may include: bonding an upper surface of the light emitting diode layer formed on the growth substrate to the transparent substrate; and removing the growth substrate from the light emitting diode layer.

The method may further include: forming a separation layer between the growth substrate and the light emitting diode layer, wherein in the removing, the separation layer is selectively etched to separate the growth substrate from the light emitting diode layer.

In the removing, the whole growth substrate may be removed by selectively etching the growth substrate from the light emitting diode layer.

The forming of a light emitting diode layer may further include forming an etching stopper layer between the growth substrate and the light emitting diode layer.

In the bonding, the transparent substrate and the light emitting diode layer may be bonded using a spin on glass (SOG).

The transferring may be performed after the substrate on which the light emitting diode layer is formed is cut into groups of the light emitting diode layers.

A surface area of the transparent substrate may be larger than a surface area of the growth substrate.

The plurality of lenses of the transparent substrate may be formed using a fusion molding method, a photolithography method, an imprinting method, or an impurity diffusion method.

The plurality of lenses may be formed of a polymer layer by attaching the polymer layer to the transparent substrate and molding the polymer layer.

The method may further include forming an interference prevention unit between the plurality of light emitting diodes.

Additional aspects and/or advantages will be set forth in part in the description which follows and, in part, will be apparent from the description, or may be learned by practice of the general inventive concept.

BRIEF DESCRIPTION OF THE DRAWINGS

The above and other features and advantages of the present general inventive concept will become more apparent by describing in detail exemplary embodiments thereof with reference to the attached drawings in which.

DETAILED DESCRIPTION

Figure 1:
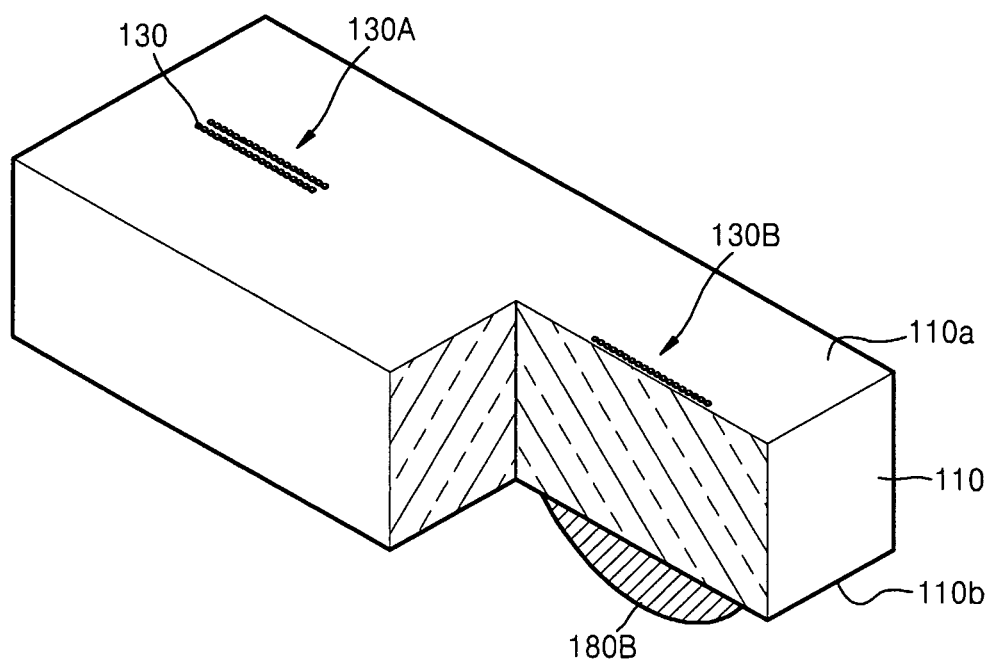
FIG. 1 is a partial cross-sectional perspective view illustrating a light emitting diode array according to an embodiment.

The present general inventive concept will now be described more fully with reference to the accompanying drawings, in which exemplary embodiments of the present general inventive concept are shown. The present general inventive concept may, however, be embodied in many different forms, and should not be construed as being limited to the embodiments set forth herein; rather, these embodiments are provided so that this disclosure will be thorough and complete, and will fully convey the concept of the present general inventive concept to those of ordinary skill in the art. Like reference numerals denote like elements throughout the specification.

Figure 2:
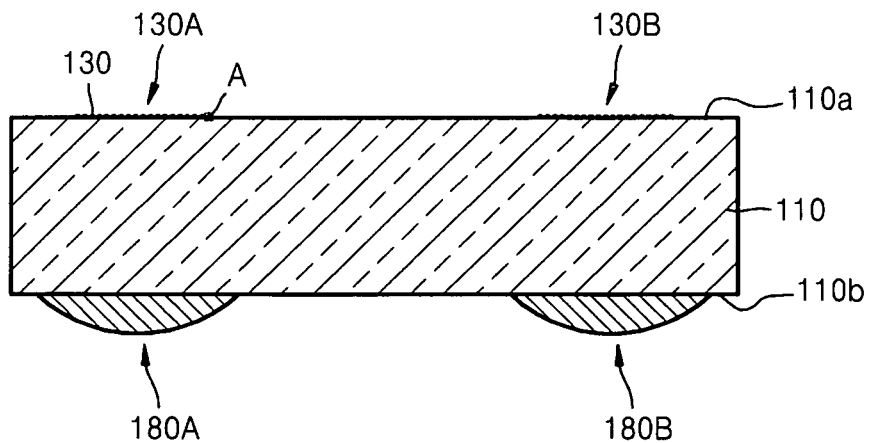
FIG. 2 is a side cross-sectional view illustrating the light emitting diode array of FIG. 1.

FIG. 1 is a partial cross-sectional perspective view illustrating a light emitting diode array according to an embodiment, and FIG. 2 is a side cross-sectional view illustrating the light emitting diode array of FIG. 1.

Referring to FIGS. 1 and 2, the light emitting diode array includes a transparent substrate 110, a plurality of light emitting diodes 130 formed on an incident surface 110a of the transparent substrate 110, and two lenses 180A and 180B formed on an exit surface 110b of the transparent substrate 110.

The transparent substrate 110 is formed of a material that is substantially transparent to light emitted from the light emitting diodes 130. For example, when the light emitting diodes 130 emit red light, the transparent substrate 110 may be formed of a material transparent to red light, such as glass, sapphire, GaP, plastic, or the like.

The transparent substrate 110 may be a flat substrate having the incident surface 110a and the exit surface 110b that are flat and parallel to each other. According to circumstances, the incident surface 110a and the exit surface 110b may be inclined with respect to each other or have a circular shape. For example, when the light emitting diode array is used as a line printer head as will be described later, the transparent substrate 110 may have a rectangular bar shape.

Figure 3:
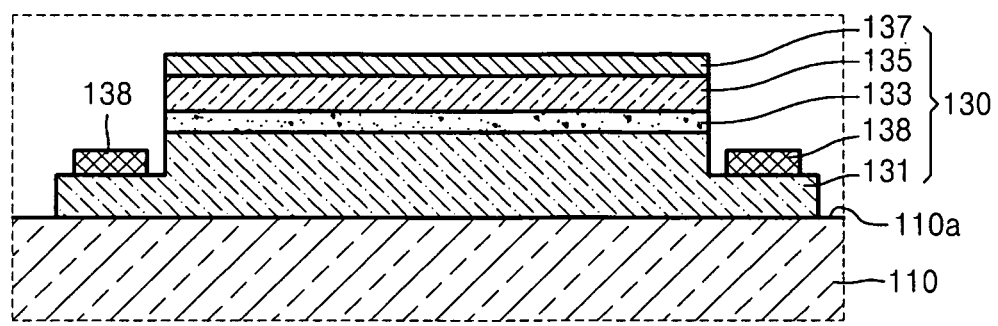
FIG. 3 is an enlarged view of a portion A of the light emitting diode array of FIG. 2.

The light emitting diodes 130 are disposed on the incident surface 110a of the transparent substrate 110. The configuration of each of the light emitting diodes 130 will be described with reference to FIG. 3. FIG. 3 is an enlarged view of a portion A of the light emitting diode array of FIG. 2. Referring to FIG. 3, each of the light emitting diodes 130 includes a first conductivity compound semiconductor layer 131 that is bonded to the transparent substrate 110, an active layer 133 formed on the first conductivity compound semiconductor layer 131, a second conductivity compound semiconductor layer 135 formed on the active layer 133, a first electrode layer 138 formed on a portion of the first conductivity compound semiconductor layer 131, and a second electrode layer 137 formed on the second conductivity compound semiconductor layer 135. The first and second electrode layers 138 and 137 are in ohmic contact with the first and second conductivity compound semiconductor layers 131 and 135, respectively, to supply electrons or holes, and may be formed of a metal having good conductivity. For example, the first and second electrode layers 138 and 137 may be formed of a single material layer such as Au, Ni, Ti, Al, or the like, or a double layer structure formed of these. When the transparent substrate 110 is formed of a conductive material such as GaP, the transparent substrate 110 may function as an electrode for the first conductivity compound semiconductor layer 131, instead of the first electrode layer 138. The second electrode layer 137 covers an upper portion of the second conductivity compound semiconductor layer 135, thereby functioning as a reflection layer to light emitted from the active layer 133.

The first conductivity compound semiconductor layer 131, the active layer 133, and the second conductivity compound semiconductor layer 135 are epitaxial layers which are formed by epitaxy. The first conductivity compound semiconductor layer 131 may be formed of, for example, an N-doped compound semiconductor, and the second conductivity compound semiconductor layer 135 may be formed of, for example, a P-doped compound semiconductor, or vice versa. The active layer 133 may be formed of a P-doped, N-doped, or non-doped compound semiconductor, and may have a single quantum well structure or a multiple quantum well structure. Holes or electrons supplied from the first and second conductivity compound semiconductor layers 131 and 135 recombine in the active layer 133, thereby emitting light.

A wavelength of light emitted from the active layer 133 is determined according to an energy band gap of a compound semiconductor. A substrate on which an epitaxial layer of the compound semiconductor is grown is limited due to lattice mismatch of the epitaxial layer and the substrate. For example, a compound semiconductor that emits red light is usually crystalline grown in a GaAs substrate, and the GaAs substrate is opaque to light having red wavelengths. The epitaxial layer may be a compound semiconductor that is crystalline grown in the GaAs substrate and that emits red light; in detail, the epitaxial layer may be a GaAsP, AlGaAs, InGaP, or InGaAlP compound semiconductor. As will be described later, after the epitaxial layer is grown, the GaAs substrate is removed.

Figure 13:
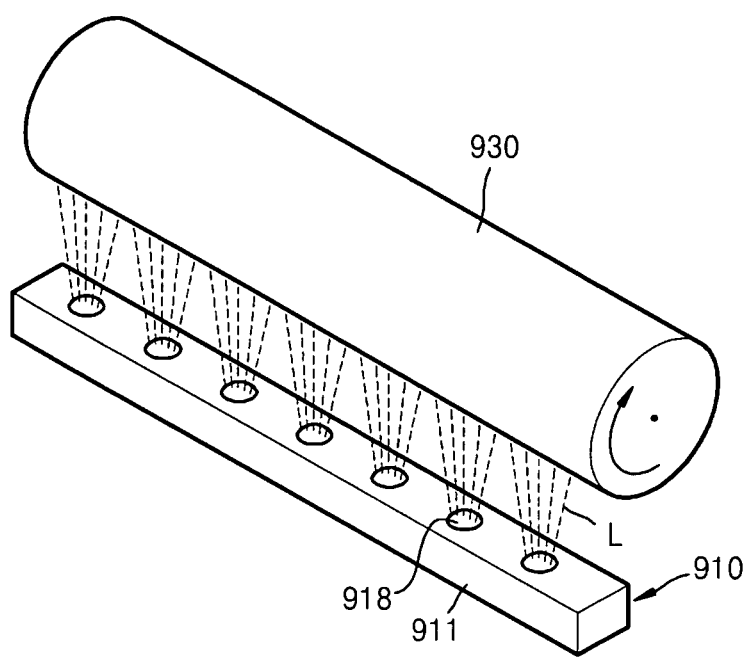
FIG. 13 is a perspective view illustrating one of a plurality of line printer heads and one of a plurality of photosensitive drums of the image forming apparatus of FIG. 12.

Referring to FIGS. 1 and 2, the light emitting diodes 130 are disposed on the transparent substrate 110 in two groups 130A and 130B. The two groups 130A and 130B of the light emitting diodes 130 may be bonded to the transparent substrate 110 in units of separate wafers or flip-chip bonded to the transparent substrate 110. The above arrangement of the light emitting diodes 130 in two groups 130A and 130B is an example, and it may be obvious to one of ordinary skill in the art to arrange the light emitting diodes 130 in more than two groups. When the light emitting diodes 130 are divided into three or more groups, the groups may be arranged in rows at equivalent distances. Lenses arranged corresponding to the arranged groups of the light emitting diodes are shown in FIG. 13.

The groups 130A and 130B include at least two light emitting diodes 130, respectively. The light emitting diodes 130 are arranged in two rows in each of the groups 130A and 130B. Here, the two rows of the light emitting diodes 130 may be arranged in a staggered pattern so that one row fills gaps of the other with respect to a side view. Thus, the light emitting diodes 130 are densely arranged in the light emitting diode array with respect to a side view.

The light emitting diodes 130 may be arranged in a line or in three or more rows in the groups 130A and 130B. When the light emitting diodes 130 are arranged in at least three rows, the light emitting diodes 130 of the rows in each of the groups 130A and 130B may be arranged in a staggered pattern so that one row fills gaps of the other with respect to a side view.

A distance between the groups 130A and 130B of the light emitting diodes 130 may be larger than the distances between the rows of the light emitting diodes 130 in each of the groups 130A and 130B. Thus, by arranging the groups 130A and 130B of the light emitting diodes 130 with a large distance therebetween, interference of light beams emitted from the two neighboring groups 130A and 130B may be prevented.

The two lenses 180A and 180B respectively correspond to the two groups 130A and 130B of the light emitting diodes 130, and light emitted from the light emitting diodes 130 is magnified with a predetermined magnification on a predetermined image plane (reference numeral 199 in FIG. 4) to form an image thereon. The two lenses 180A and 180B may be directly formed on the exit plane 110b of the transparent substrate 100 by using a method such as a fusion molding method, a photolithography method, or an imprinting method.

Figure 4:
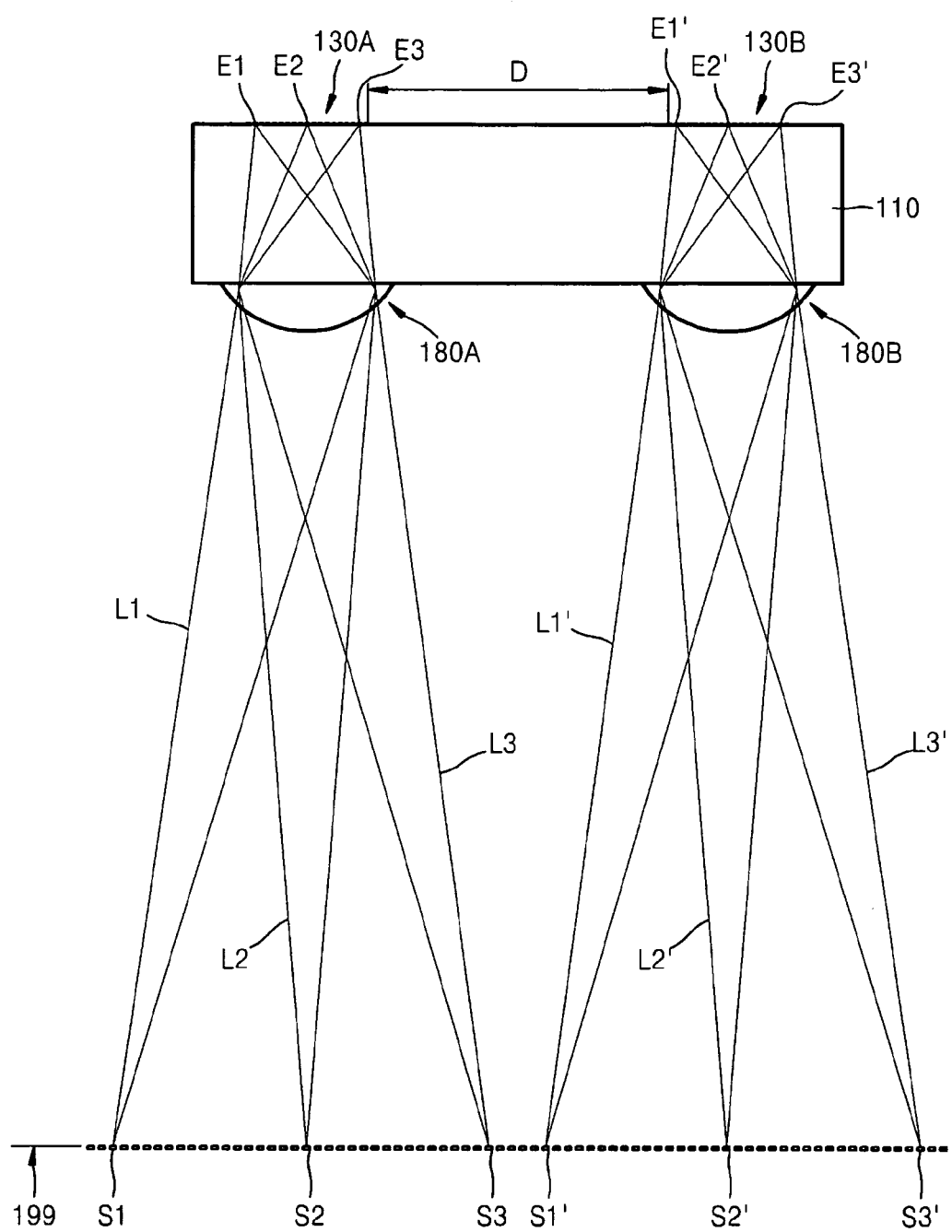
FIG. 4 is a schematic view for explaining the operation of the light emitting diode array of FIG. 1.

The two lenses 180A and 180B are arranged and designed such that spots of light beams that are emitted from the light emitting diodes 130 and formed on an image plane are at equivalent distances in the arrangement direction of the light emitting diodes 130. Here, the two lenses 180A and 180B are arranged as an example, and it is obvious to one of ordinary skill in the art that more lenses may also be arranged. If three or more lenses are arranged, they may be arranged in a line as illustrated in FIG. 4. The direction of the arrangement of the groups 130A and 130B of the light emitting diodes 130 is identical to the direction of the arrangement of the lenses 180A and 180B.

In the light emitting diode array according to the current embodiment, the two lenses 180A and 180B magnify light emitted from the light emitting diodes 130 in each of the groups 130A and 130B with a predetermined magnification, thereby preventing crosstalk in the groups 130A and 130B which may be generated while a light beam travels through the transparent substrate 110. Also, in the light emitting diode array, the groups 130A and 130B of the light emitting diodes 130 are sufficiently separated apart from each other, thereby preventing crosstalk therebetween. Furthermore, the two lenses 180A and 180B are disposed on the transparent substrate 110, and thus light may be focused without using an additional optical unit and be emitted. Thus, a compact device having a simple optical configuration may be obtained. Also, the lenses 180a and 180B are disposed on the transparent substrate 110, and thus a distance between the lenses 180A and 180B and the light emitting diodes 130 is small and uniform. Accordingly, light extraction efficiency may be increased and uniformity of the light may be maintained.

Also, a portion of the incident surface 110a (see FIG. 1) of the transparent substrate 110 where the light emitting diodes 130 are not formed may be covered with a reflection layer (not shown). The reflection layer allows light emitted from the light emitting diodes 130 to proceed toward the exit surface 110b of the transparent substrate 110, thereby increasing the light extraction efficiency of the light emitting diode array.

FIG. 4 is a schematic view for explaining the operation of the light emitting diode array of FIG. 1.

Referring to FIG. 4, the groups 130A and 130B of the light emitting diodes 130 corresponding to the lenses 180A and 180B, respectively, are separated apart a distance D.

The two lenses 180A and 180B allow that light beams L1, L2, and L3; and L1', L2', and L3' emitted from light emitting points E1, E2, and E3; and E1', E2', and E3', respectively, are magnified with a predetermined magnification on the image plane 199 to form an image. The image plane 199 may be a scanning surface of a photosensitive medium 930 (see FIG. 13) as will described later. Since the two lenses 180A and 180B magnify the light beams emitted from the light emitting points E1, E2, and E3; and E1', E2', and E3', distances between spots S1, S2, AND S3; and S1', S2', AND S3' formed on the image plane 199 may be larger than distances between the light emitting points E1, E2, and E3; and E1', E2', and E3'.

Thus, as the distances between the spots S1, S2, and S3; and S1', S2', AND S3' are larger than the distances between the light emitting points E1, E2, and E3; and E1', E2', and E3', crosstalk between the light emitting points E1, E2, and E3; and E1', E2', and E3' in each of the groups 130A and 130B may be reduced.

Also, by setting an appropriate refractive power of the two lenses 180A and 180B, sufficient distances between the spots S1, S2, and S3; and S1', S2', AND S3' are provided, and the light emitting points E1, E2, and E3; and E1', E2', and E3' may be densely arranged. For example, when the light emitting diode array according to the current embodiment is used as a line printer head of an image forming apparatus, sufficient distances between the spots S1, S2, and S3; and S1', S2', and S3' corresponding to a required resolution are provided, and a surface area of each of the groups 130A and 130B contacting the incident surface 110a of the transparent substrate 110 may be maintained small. Thus, with the small surface of the two groups 130A and 130B of the light emitting diodes 130, the distance D between the two groups 130A and 130B may be increased. By providing a sufficient distance D, interference between light beams L1, L2, and L3 emitted from the light emitting points E1, E2, and E3 of the group 130A and light beams L1', L2', and L3' emitted from the light emitting points E1', E2', and E3' of the group 130B may be prevented. Also, when the surface of the two groups 130A and 130B of the light emitting diodes 130 is small, the sizes of the separate wafers in the light emitting diodes 130 allocated to the groups 130A and 130B are small, thereby reducing the manufacturing costs of the light emitting diode array.

Figure 5A:
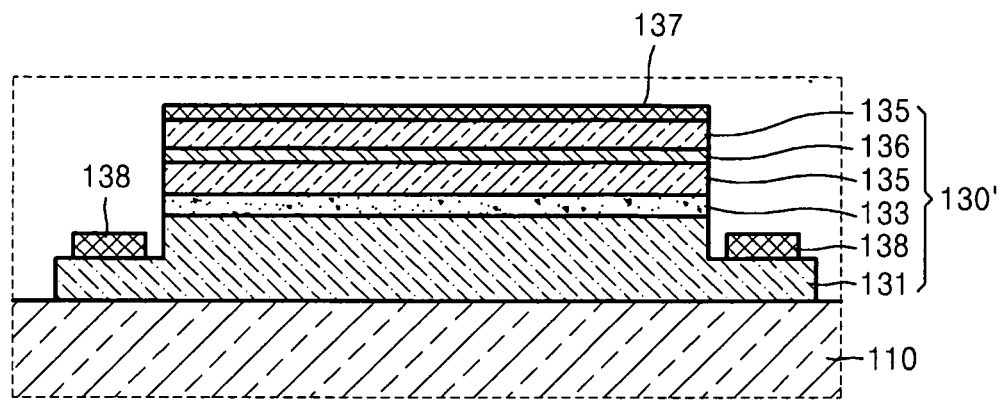
FIGS. 5A through 5C illustrate light emitting diodes used in a light emitting diode array, according to the embodiments.
Figure 5B:
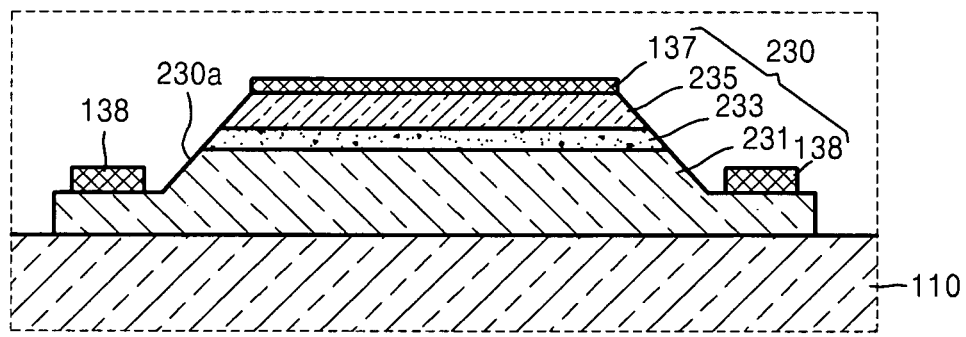
Figure 5C:
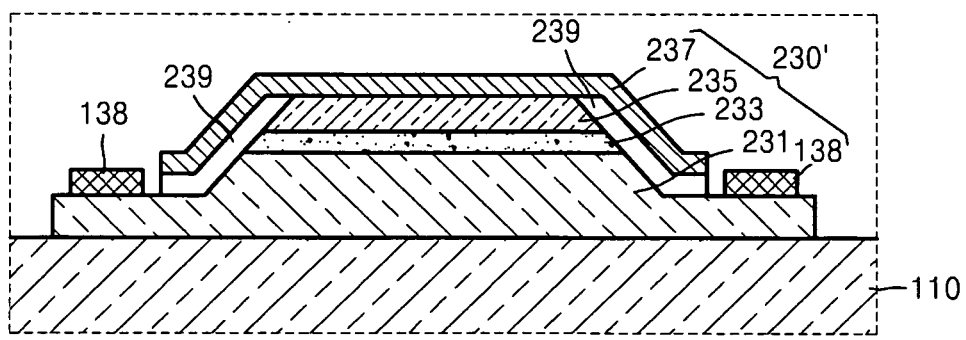

FIGS. 5A through 5C illustrate light emitting diodes 130', 230, and 230' used in a light emitting diode array, according to embodiments of the present general inventive concept.

FIG. 5A illustrates the light emitting diode 130' used in a light emitting diode array, according to an embodiment.

Referring to FIG. 5A, the light emitting diode 130' includes a first conductivity compound semiconductor layer 131 bonded to a transparent substrate 110, an active layer 133 formed on the first conductivity compound semiconductor layer 131, a second conductivity compound semiconductor layer 135 formed on the active layer 133, a reflection layer 136 formed on the second conductivity compound semiconductor layer 135, a first electrode layer 138 formed on a portion of the first conductivity compound semiconductor layer 131, and a second electrode layer 137 formed on another second conductivity compound semiconductor layer 135 formed on the reflection layer 136. The light emitting diode 130' is substantially the same as the light emitting diode 130 of FIG. 3, except that the reflection layer 136 is further included between the second conductivity compound semiconductor layers 135.

The reflection layer 136 reflects light that proceeds upward toward the transparent substrate 110 among light isotropically emitted from the active layer 133, thereby increasing the light extraction efficiency of the light emitting diode 130'. The reflection layer 136 may be a distributed Bragg reflector (DBR) layer that is formed by alternately stacking materials having difference refractive indices. A DBR layer is well known in the art, and thus description thereof will be omitted. Referring to FIG. 5A, the reflection layer 136 is inserted into the second conductivity compound semiconductor layer 135, but is not limited thereto; the reflection layer 136 may be formed on an upper surface of the second conductivity compound semiconductor layer 135.

FIG. 5B illustrates the light emitting diode 230 used in a light emitting diode array, according to another embodiment.

Referring to FIG. 5B, the light emitting diode 230 includes a first conductivity compound semiconductor layer 231 bonded to a transparent substrate 110, an active layer 233 formed on the first conductivity compound semiconductor layer 231, a second conductivity compound semiconductor layer 235 formed on the active layer 233, a first electrode layer 138 formed on a portion of the first conductivity compound semiconductor layer 231, and a second electrode layer 137 formed on the second conductivity compound semiconductor layer 235.

The light emitting diode 230 has an inclined surface 230a and a truncated pyramid shape. The inclined surface 230a reflects light emitted from the active layer 233 to the transparent substrate 110, thereby increasing the light extraction efficiency of the light emitting diode 230. According to the current embodiment, the light emitting diode 230 has a truncated pyramid shape, but is not limited thereto; the light emitting diode 230 may have various shapes for improving the light extraction efficiency of the light emitting diode 230. The light emitting diode 230 is substantially the same as the light emitting diode 130 of FIG. 1, except for the truncated pyramid shape of the light emitting diode 230.

FIG. 5C illustrates the light emitting diode 230' used in a light emitting diode array, according to another embodiment.

Referring to FIG. 5C, the light emitting diode 230' includes a first conductivity compound semiconductor layer 231 bonded to a transparent substrate 110, an active layer 233 formed on the first conductivity compound semiconductor layer 231, a second conductivity compound semiconductor layer 235 formed on the active layer 233, a first electrode layer 138 formed on a portion of the first conductivity compound semiconductor layer 231, and a second electrode layer 237 that substantially covers a remaining portion except the portion where the first electrode 138 is formed, and an insulation layer 239 provided beneath the second electrode layer 237 except an area where the second electrode 237 contacts the second conductivity compound semiconductor layer 235. The light emitting diode 230' is substantially the same as the light emitting diode 130 of FIG. 3 except a coverage of the second electrode layer 237.

As the second electrode layer 237 substantially functions as a reflection layer, light emitted from the active layer 233 is reflected by the second electrode layer 237 and proceeds toward the transparent substrate 110, thereby increasing the light extraction efficiency of the light emitting diode 230'. To this end, the second electrode layer 237 may be formed of a metal having good reflection characteristics, and may have a sufficient thickness so that light is not transmitted therethrough.

Figure 6:
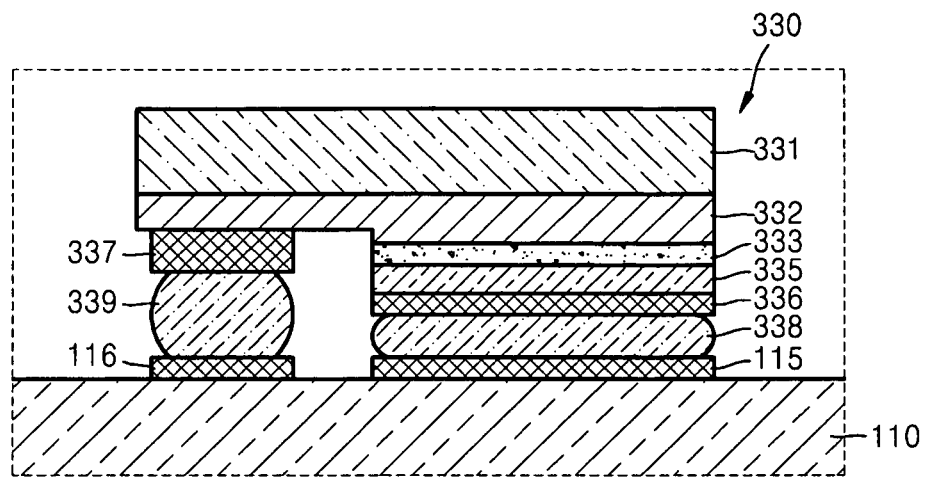
FIG. 6 illustrates a light emitting diode used in a light emitting diode array, according to an embodiment.

FIG. 6 illustrates a light emitting diode 330 used in a light emitting diode array, according to another embodiment.

Referring to FIG. 6, the light emitting diode 330 includes a first conductivity compound semiconductor layer 332 that is flip chip-bonded to a transparent substrate 110 and is crystalline-grown on a growth substrate 331, an active layer 333 formed on the first conductivity compound semiconductor layer 332, a second conductivity compound semiconductor layer 335 formed on the active layer 333, a first electrode layer 337 formed on a portion of the first conductivity compound semiconductor layer 332, and a second electrode layer 336 formed on the second conductivity compound semiconductor layer 335. Meanwhile, wiring circuits 115 and 116 for flip chip-bonding of the light emitting diode 330 may be further disposed on the transparent substrate 110. Also, the light emitting diode 330 includes solders 338 and 339 for flip-chip bonding. In FIG. 6, only the flip-chip bonded portions are described, and a light path from the active layer 333 toward the transparent substrate 110 which is not flip-chip bonded is not illustrated. Also, in FIG. 6, only one light emitting diode that is flip-chip bonded is illustrated but the flip-chip bonding may also be performed on a plurality of light emitting diodes 330 with a wafer unit.

The light emitting diode 330 according to the current embodiment is flip-chip bonded to the transparent substrate 110, and thus there is no need to remove a growth substrate, such as GaAs, used for epitaxially growing the light emitting diode 330.

Figure 7:
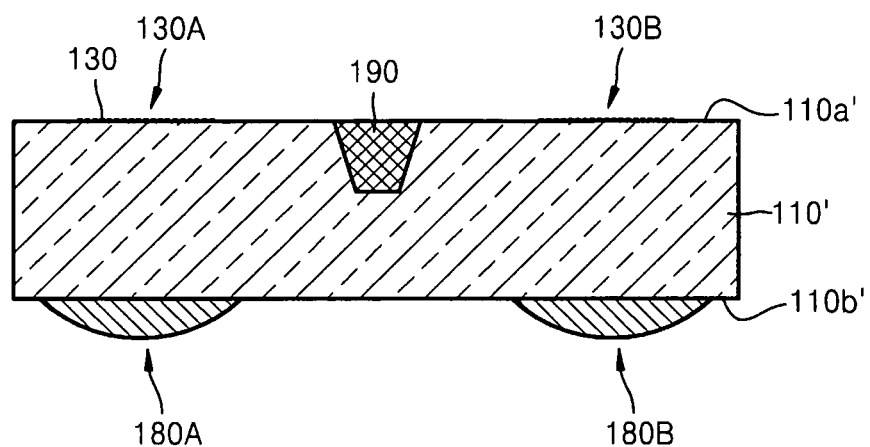
FIG. 7 is a side cross-sectional view of a light emitting diode array according to another embodiment.

FIG. 7 is a side cross-sectional view of a light emitting diode array according to another embodiment.

Referring to FIG. 7, the light emitting diode array according to the current embodiment includes a transparent substrate 110', a plurality of light emitting diodes 130 formed on an incident surface 110a' of the transparent substrate 110', an interference prevention unit 190, and two lenses 180A and 180B formed on an exit surface 110b' of the transparent substrate 110'.

The transparent substrate 110', the light emitting diodes 130, and the two lenses 180A and 180B are substantially the same as those of the light emitting diode array described with reference to FIGS. 1 through 4. The light emitting diode array of FIG. 7 is different in that the interference prevention unit 190 is further included.

The interference prevention unit 190 is formed in the incident surface 110a' of the transparent substrate 110', and is disposed between two groups 130A and 130B of the light emitting diodes 130. The interference prevention unit 190 may be formed by forming a groove in the incident surface 110a', and filling the groove with a light blocking material. For example, the light blocking material may be a black material that absorbs light. The interference prevention unit 190 may remove crosstalk caused due to light emitted from the neighboring groups 130A and 130B.

According to the current embodiment, the interference prevention unit 190 is formed in the incident surface 110a' of the transparent substrate 110', but the interference prevention unit 190 may also be formed in the exit surface 110b' of the transparent substrate 110'.

Figure 8:
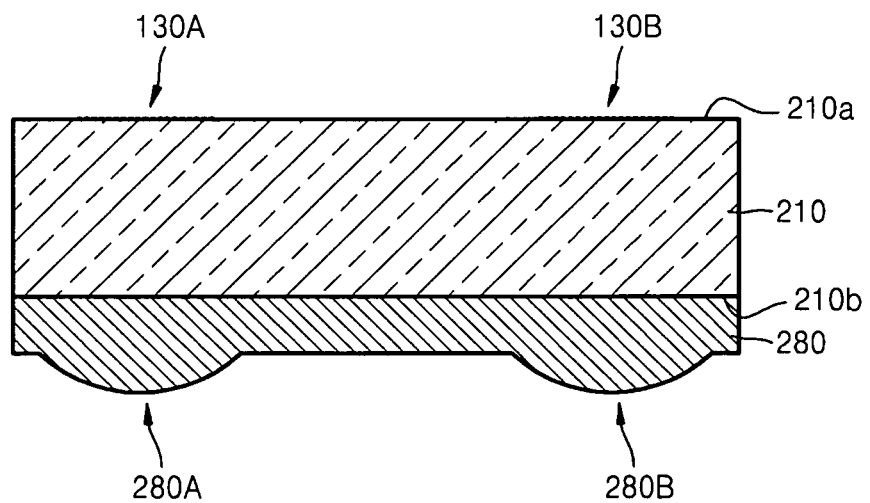
FIG. 8 is a side cross-sectional view of a light emitting diode array according to another embodiment.

FIG. 8 is a side cross-sectional view of a light emitting diode array according to another embodiment.

Referring to FIG. 8, the light emitting diode array includes a transparent substrate 210, a plurality of light emitting diodes 130 formed on an incident surface 210a of the transparent substrate 210, and a lens layer 280 formed on an exit surface 210b of the transparent substrate 210.

The transparent substrate 210 may be formed of a material that is substantially transparent to light emitted from the light emitting diodes 130. For example, the transparent substrate 210 may be formed of a material such as glass, sapphire, GaP, or plastic. The lens layer 280 may be formed of a polymer from which lenses 280A and 280B may be easily formed. For example, when the lens layer 280 is formed of polymer that can be processed at a low temperature, the polymer may be molded to form the lenses 280A and 280B by using an imprinting process after bonding the light emitting diodes 130 to the transparent substrate 210.

The light emitting diode array according to the current embodiment is substantially the same as the light emitting diode array described with reference to FIGS. 1 through 4, except that the lens layer 280 is further formed on the transparent substrate 210.

According to the embodiments described above, a surface of a transparent substrate or a surface of a lens layer is curved so as to provide refractive power, but the embodiment of the present general inventive concept is not limited thereto.

Although not illustrated in the drawing, by diffusing impurities into a flat transparent substrate to locally modulate a refractive index of the flat transparent substrate, the flat transparent substrate itself may be made to have refractive power. Since lenses as described above are well known in the art, a description thereof will be omitted.

Next, a method of manufacturing a light emitting diode array, according to an embodiment of the present general inventive concept, will be described below.

FIGS. 9A through 9F illustrate a method of manufacturing a light emitting diode array, according to an embodiment.

Figure 9A:
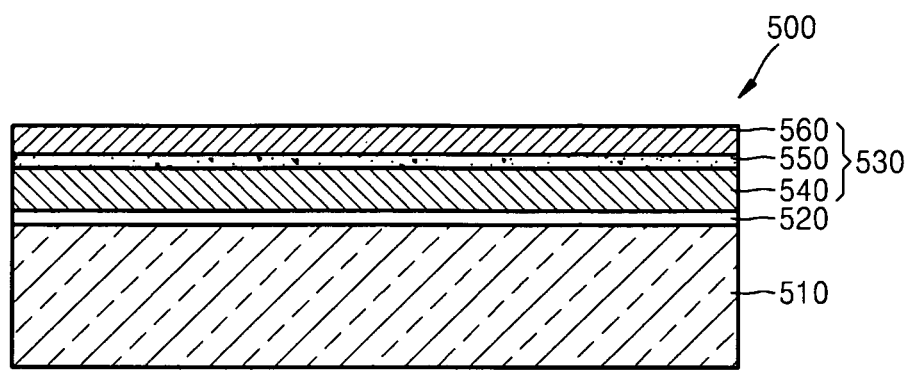
FIGS. 9A through 9F illustrate a method of manufacturing a light emitting diode array, according to an embodiment.

Referring to FIG. 9A, an epitaxial layer 530 is grown on a growth substrate 510. The epitaxial layer 530 is formed by sequentially stacking a second conductivity compound semiconductor layer 540, an active layer 550, and a first conductivity compound semiconductor layer 560. The growth substrate 510 is a crystalline substrate from which an epitaxial layer may be formed, and may be, for example, a GaAs wafer, a GaP wafer, etc. The epitaxial layer 530 may be grown by using an epitaxy method such as a metal organic chemical vapor deposition (MOCVD) method, a molecular beam epitaxy (MBE) method or a metal organic molecular beam epitaxy (MOMBE) method.

Before growing the epitaxial layer 530, a separation layer 520 may be formed on the growth substrate 510. The separation layer 520 may be formed of a material having a high etching selectivity to the epitaxial layer 530, for example, AlAs. As will be described later, the separation layer 520 is for separating the growth substrate 510 from the epitaxial layer 530, and may function as a sacrificial layer or an etch stopper layer.

Figure 9B:
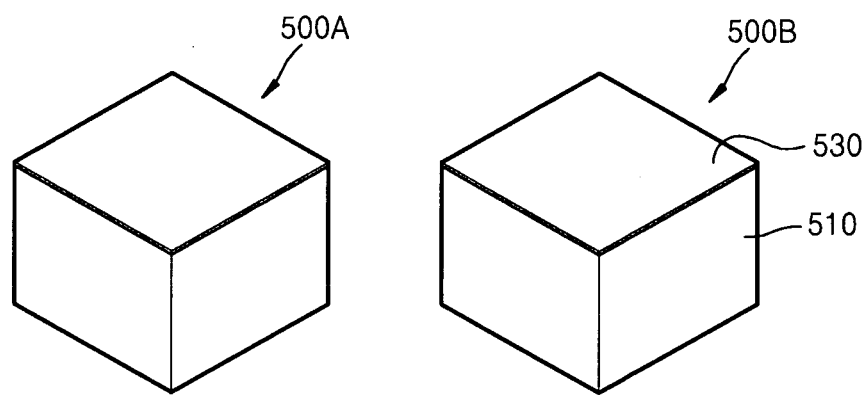

Next, referring to FIG. 9B, the growth substrate 510, on which the epitaxial layer 530 is grown, is cut in pieces on each of separate wafers to form separate wafers 500A and 500B. The sizes of the separate wafers 500A and 500B may be determined in consideration of the magnifications of lenses 680A and 680B (see FIG. 9D) or a distance between the lenses 680A and 680B.

Figure 9C:
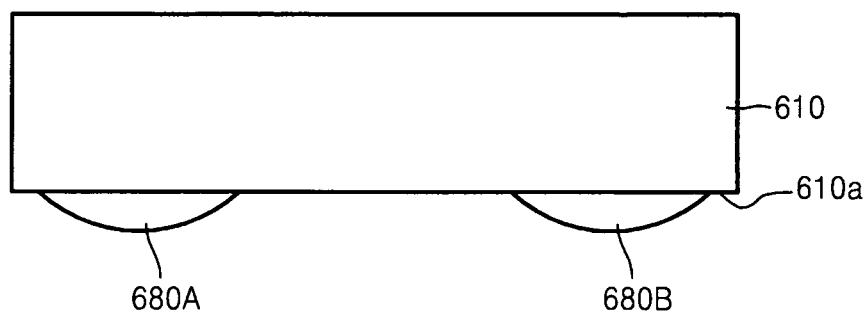

Also, referring to FIG. 9C, a transparent substrate 610 on a surface 610a of which the lenses 680A and 680B are formed is provided. For example, the transparent substrate 610 may be formed of glass, plastic, or polymer. For example, the lenses 680A and 680B may be formed by using a fusion molding method. Also, the lenses 680A and 680B may be formed on the transparent substrate 610 by using a photolithography method or an imprinting method. In FIG. 9C, the lenses 680A and 680B formed by processing the surface 610a of the transparent substrate 610 to have a predetermined curvature are illustrated, but the present embodiment is not limited thereto. For example, a flat lens may be formed by diffusing impurities into the transparent substrate 610 to locally modulate a refractive index.

Figure 9D:
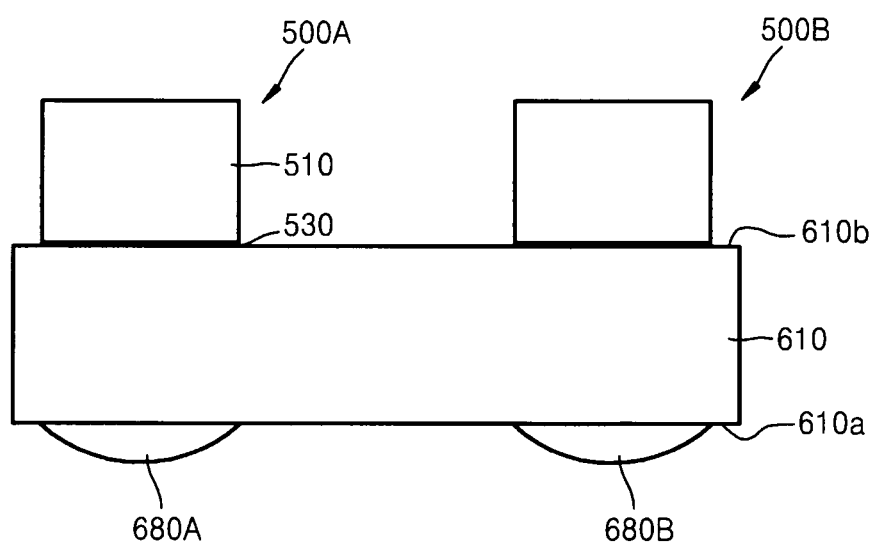

Next, referring to FIG. 9D, surfaces of the separate wafers 500A and 500B on which the epitaxial layer 530 is formed, and a surface 610b of the transparent substrate 610, which is opposite to the surface 610a on which the lenses 680A and 680B are formed, are bonded to each other. The separate wafers 500A and 500B are positioned to respectively correspond to the lenses 680A and 680B of the transparent substrate 610. For example, the surface bonding may be conducted by using heat and pressure. To facilitate the surface bonding, a spin on glass (SOG) may be coated on the surface 610b of the transparent substrate 610, or an upper surface of the epitaxial layer 530.

Figure 9E:
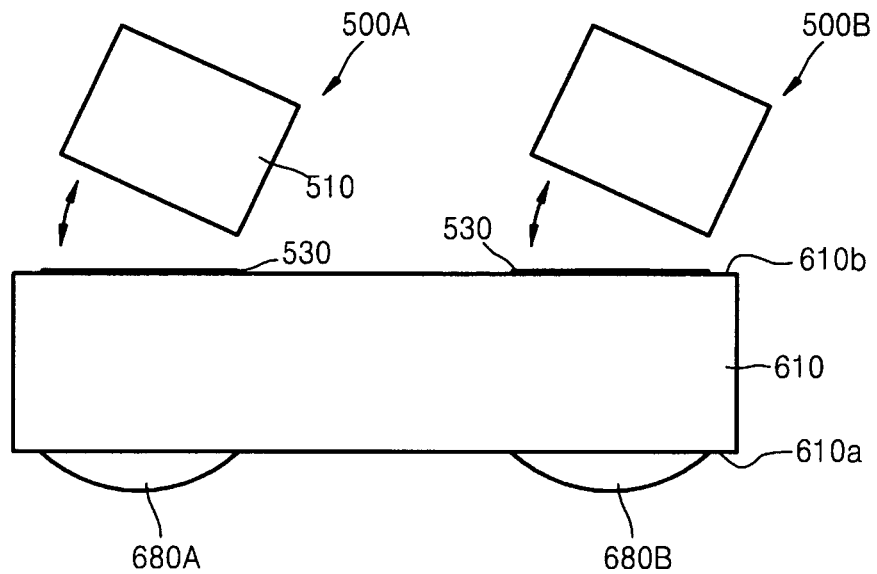

Next, referring to FIG. 9E, the growth substrate 510 is separated from the epitaxial layer 530. For example, by using a difference in the etching selectivities of the growth substrate 510 and the separation layer 520 of FIG. 9A, the growth substrate 510 may be completely etched, thereby removing the growth substrate 510. Alternatively, the growth substrate 510 may be separated from the epitaxial layer 630 by removing the separation layer 520 by using a difference in the etching selectivities between the separation layer 520 and other layers. Thus, by removing the growth substrate 510, only the epitaxial layer 530 bonded to the transparent substrate 610 remains on the transparent substrate 610.

Figure 9F:
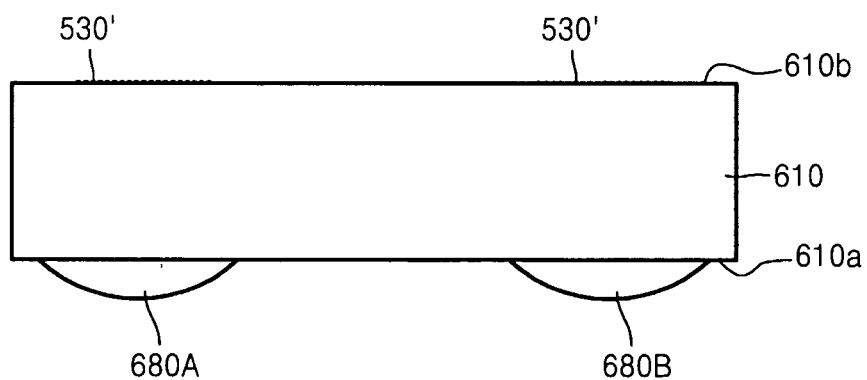

Next, referring to FIG. 9F, a photolithography process and a metal patterning process are performed on the epitaxial layer 530 to etch the epitaxial layer 530 and form an electrode layer, thereby forming a light emitting diode 530' having the structure as that of light emitting diode 130 of illustrated in FIG. 3. A plurality of the light emitting diodes 530' are grouped into units of separate wafers during the manufacturing process, and are densely arranged according to groups.

FIGS. 10A through 10D illustrate a method of manufacturing a light emitting diode array, according to another embodiment.

The method according to the current embodiment is substantially the same as the method described with reference to FIGS. 9A through 9F, except the order of forming lenses.

That is, first, separate wafers 500A and 500B, each including an epitaxial layer 530 which is formed on a growth substrate 510, are provided as described above with reference to FIGS. 9A and 9B.

Figure 10A:
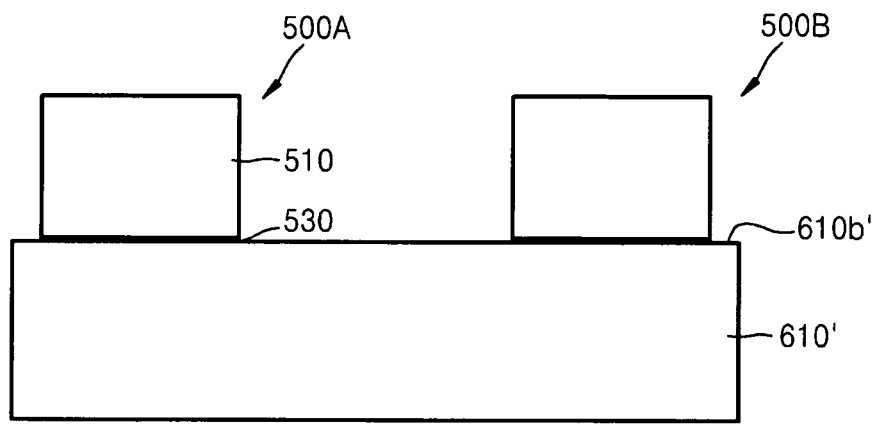
FIGS. 10A through 10D illustrate a method of manufacturing a light emitting diode array, according to another embodiment.

Next, as illustrated in FIG. 10A, a flat transparent substrate 610' is provided, and the separate wafers 500A and 500B are bonded to a surface 610b' of the transparent substrate 610' at predetermined intervals. For example, the transparent substrate 610' may be formed of glass, plastic, polymer, etc.

Figure 10B:
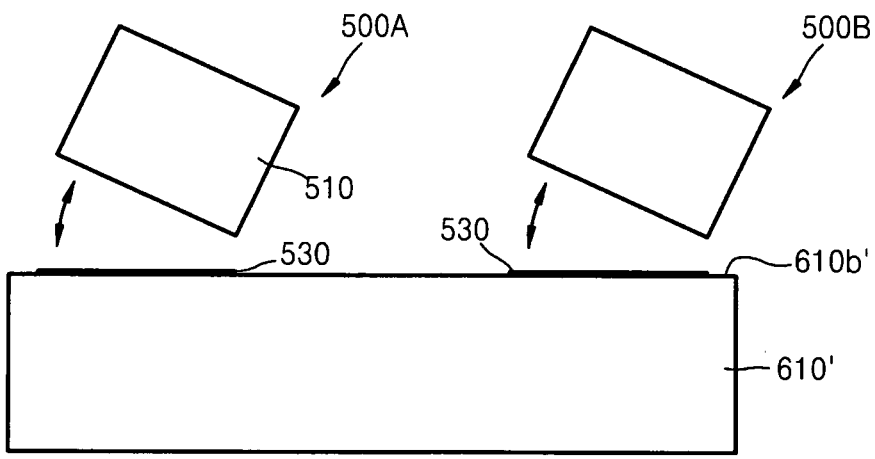

Next, referring to FIG. 10B, the growth substrate 510 is separated from the epitaxial layer 530 so that only the epitaxial layer 530 remains bonded to the surface 610b' of the transparent substrate 610'.

Figure 10C:
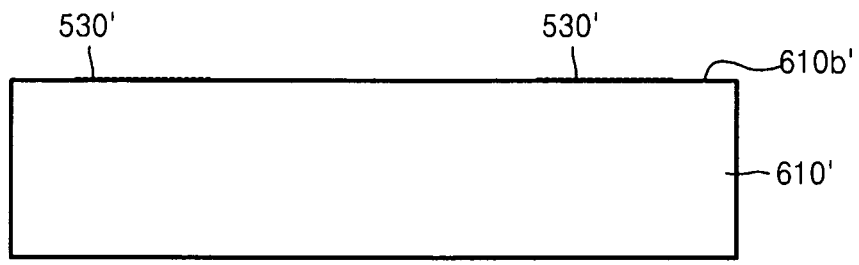

Next, referring to FIG. 10C, a photolithography process and a metal patterning process are performed on the epitaxial layer 530 to etch the epitaxial layer 530 and form an electrode layer, thereby forming a light emitting diode 530' having the structure as that of the light emitting diode 130 illustrated in FIG. 3. A plurality of the light emitting diodes 530' are grouped in units of separate wafers during the manufacturing process, and are densely arranged according to groups.

Figure 10D:
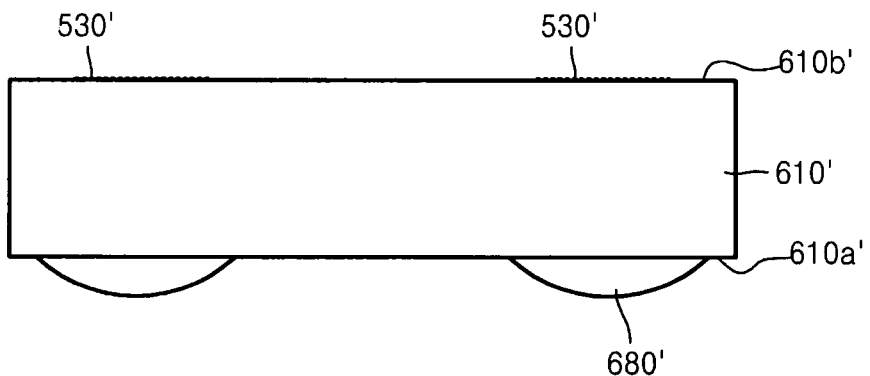

Next, referring to FIG. 10D, a lens 680' is formed on a surface 610a' opposite to the surface 610b' of the transparent substrate 610'. The lens 680' is formed for each group of the light emitting diodes 530', that is, on each area where the separate wafers are attached. The lens 680' may be formed by using a photolithography process or an imprinting process. According to circumstances, a transparent polymer may be coated on the surface 610a' opposite to the surface 610b' where the epitaxial layer 530' is bonded, and then the coated transparent polymer layer may be processed to a lens surface by using, for example, an imprinting process.

FIGS. 11A through 11E illustrate a method of manufacturing a light emitting diode array, according to another embodiment.

Figure 11A:
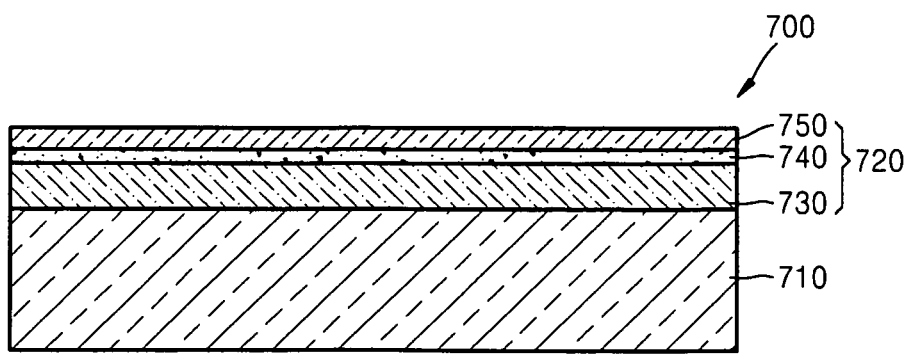
FIGS. 11A through 11E illustrate a method of manufacturing a light emitting diode array, according to another embodiment.

Referring to FIG. 11A, an epitaxial layer 720 is grown on a growth substrate 710. The epitaxial layer 720 is formed by sequentially stacking a first conductivity compound semiconductor layer 730, an active layer 740, and a second conductivity compound semiconductor layer 750. The growth substrate 710 may be a crystalline substrate on which an epitaxial layer may be formed, and may be, for example, a GaAs wafer, a GaP wafer, etc. The epitaxial layer 720 may be grown by using an epitaxy method such as an organic metal chemical vapor deposition (CVD) method or MOMBE.

Figure 11B:
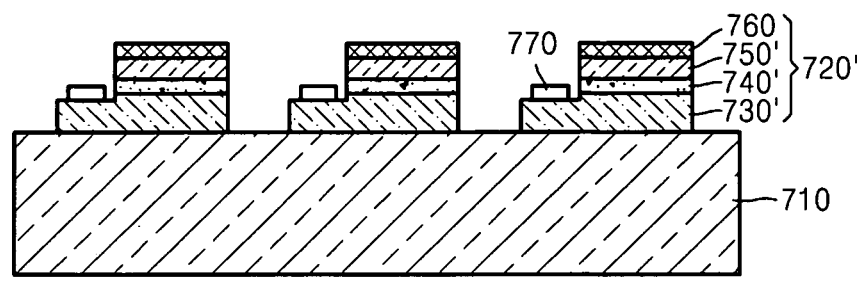

Next, referring to FIG. 11B, a photolithography process and a metal patterning process may be performed on the epitaxial layer 720 to etch the epitaxial layer 720 and form electrode layers 760 and 770, thereby forming a light emitting diode 720'.

Figure 11C:
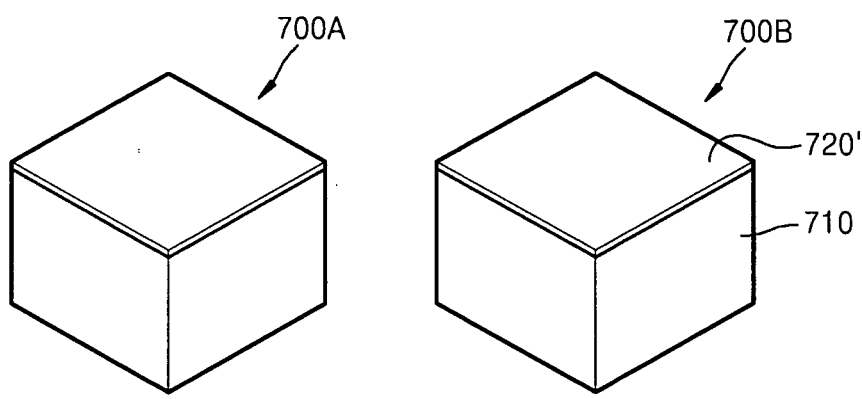

Next, referring to FIG. 11C, the growth substrate 710 on which a plurality of the light emitting diodes 720' are formed are cut in pieces on each of separate wafers, thereby providing separate wafers 700A and 700B.

Figure 11D:
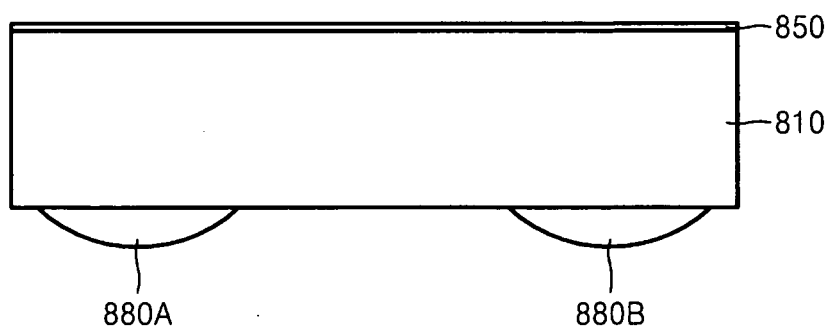

Also, as illustrated in FIG. 11D, a transparent substrate 810 is formed in such a way that on a surface thereof lenses 880A and 880B are formed, and on the other surface thereof a wiring circuit 850 is formed. The transparent substrate 810 may be formed of, for example, glass, plastic, polymer, etc. For example, the lenses 880A and 880B may be formed on the transparent substrate 810 by using a fusion molding method, a photolithography method, or an imprinting method.

Figure 11E:
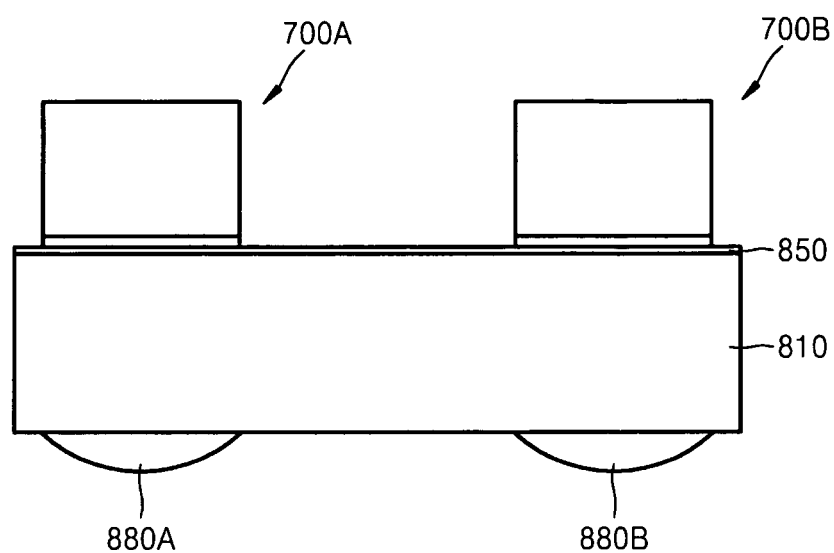

Next, referring to FIG. 11E, surfaces of the separate wafers 700A and 700b on which the light emitting diodes 720' are formed, and the surface of the transparent substrate 810 on which the wiring circuit 850 is formed are bonded by flip-chip bonding. The separate wafers 700A and 700B are positioned so as to respectively correspond to the lenses 880A and 880B of the transparent substrate 810.

Figure 12:
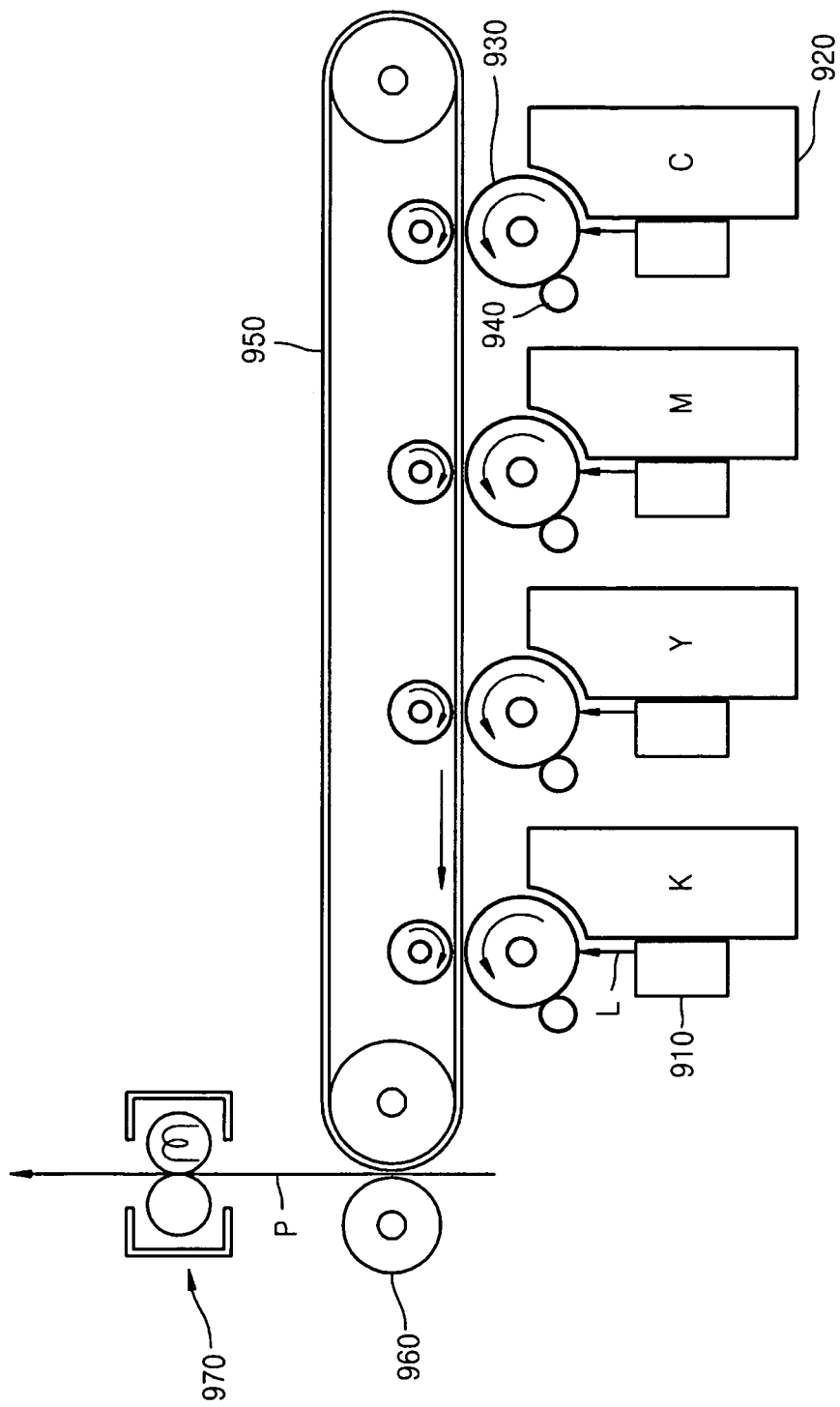
FIG. 12 is a schematic diagram illustrating an image forming apparatus in which a light emitting diode array according to an embodiment is used as a line printer head.

FIG. 12 is a schematic diagram illustrating an image forming apparatus in which a light emitting diode array according to an embodiment is used as a line printer head. FIG. 13 is a perspective view illustrating one of a plurality of line printer heads 910 and one of a plurality of photosensitive drums 930 of the image forming apparatus of FIG. 12.

Referring to FIG. 12, the image forming apparatus may include the line printer heads 910, developing units 920, the photosensitive drums 930, charging rollers 940, an intermediate transfer belt 950, a transfer roller 960, and a fixing unit 970.

The line printer head 910 scans on the photosensitive drum 930 linear light L that is modulated according to image information, and may include any of the light emitting diode arrays described with reference to FIGS. 1 through 8. The photosensitive drum 930 is an example of a photoreceptor, and includes a photosensitive layer having a predetermined thickness on an outer circumferential surface of a cylinder metal pipe. The outer circumferential surface of the photosensitive drum 930 is a surface of the photoreceptor whereon the light L scanned by the line printer head 910 forms an image. Also, a belt-type photosensitive belt may be used as a photoreceptor. A corresponding charging roller 940 is rotated while contacting the photosensitive drum 930 and charges the surface of the photosensitive drum 930 to a uniform electric potential. A charging bias voltage Vc is applied to the corresponding charging roller 940. A corona charger (not shown) may be used instead of the corresponding charging roller 940. Toner is contained in a corresponding developing unit 920. The toner is transported to the photosensitive drum 930 in response to a developing bias voltage applied between the corresponding developing unit 920 and the photosensitive drum 930 and develops an electrostatic latent image into a visible toner image. The visible toner image formed on the photosensitive drum 930 is transferred to the intermediate transfer belt 950. The toner image is then transferred to a paper P that is transported between the transfer roller 960 and the intermediate transfer belt 950 by applying a transfer bias voltage to the charging rollers 940. The toner image transferred to the paper P is fixed on the paper P by heat and pressure from the fixing unit 970, thereby completing formation of an image.

In order to print a color image, each of the line printer heads 910, each of the developing units 920, and each of the photosensitive drums 930 corresponding to one color are included. The line printer heads 910 respectively scan four light beams to the four photosensitive drums 930. In the four photosensitive drums 930, electrostatic latent images corresponding to image information of black (K), magenta (M), yellow (Y), and cyan (C) are formed. The four developing units 820 supply toner of black (K), magenta (M), yellow (Y), and cyan (C) colors to the photosensitive drums 930 to form toner images of black (K), magenta (M), yellow (Y), and cyan (C) colors. The toner images of black (K), magenta (M), yellow (Y), and cyan (C) color are transferred to the intermediate transfer belt 950 and overlapped thereon, and then are transferred to the paper P again.

Referring to FIG. 13, the line printer heads 910 are disposed several to several tens of mm apart from the photosensitive drums 930, and emit a plurality of light beams L arranged in a main scanning direction onto an outer circumferential surface of the photosensitive drums 930 according to image information. The line printer head 910 exposes the photosensitive drum 930 line-by-line, and a two-dimensional electrostatic latent image is formed on the outer circumferential surface of the photosensitive drum 930 as the photosensitive drum 930 is rotated.

The line printer head 910 may have a structure as those illustrated in FIGS. 1 through 8. That is, in the line printer head 910, a plurality of lenses 918 are disposed on a transparent substrate 911, and a plurality of light emitting diodes (not shown) are arranged on the other surface of the transparent substrate 911 to correspond to the plurality of the lenses 918, respectively, thereby forming a light emitting diode array. Light beams L emitted through the plurality of lenses 918 at equal distances may be formed as images on the outer circumferential surface of the photosensitive drum 930. A light beam emitted from the light emitting diodes has a large luminous view angle and is thus diverged, and in order to collimate or focus a plurality of the light beams that are usually arranged at several tens of μm, an expensive optical device such as a rod lens array (RLA) is needed. However, in the line printer head 910, as the plurality of the lenses 918 are arranged on the transparent substrate 911, no optical unit is required. Accordingly, a simple light scanning optical system may be realized with reduced manufacturing costs. Also, since the line printer head 910 having a compact size may be manufactured, the degree of freedom of a system design of an image forming apparatus may also be increased.

According to light emitting diode arrays of the embodiments, light emitted from light emitting diodes may proceed parallel or be efficiently focused at a predetermined distance. In addition, distances between the lens and the light emitting diodes may be kept close as much as a thickness of a substrate and uniform. Thus, the light beam extraction efficiency of the light emitting diode may be increased and the uniformity of light beams emitted therefrom may be maintained.

According to a line printer head using light emitting diode arrays according to the embodiments, light may be focused on a scanning surface without using an RLA. Also, when the light emitting diode array according to the embodiments of the present general inventive concept is used as a line printer head, no RLA is required, and thus the manufacturing costs of the line printer head may be significantly reduced, and the size of the line printer head may also be reduced, thereby increasing the degree of freedom of a system design of a printer.

Also, according to a method of manufacturing the light emitting diode array, a light emitting diode integrated with a lens may be manufactured in one process, thereby reducing manufacturing costs.

While the present general inventive concept has been particularly shown and described with reference to exemplary embodiments thereof, it will be understood by those of ordinary skill in the art that various changes in form and details may be made therein without departing from the spirit and scope of the present general inventive concept as defined by the following claims.

What is claimed is:

1. A light emitting diode array comprising:
   a transparent substrate comprising an incident surface and an exit surface;
   a plurality of light emitting diodes disposed on the incident surface of the transparent substrate; and
   a plurality of lenses that are disposed on the exit surface of the transparent substrate to magnify light emitted from the plurality of light emitting diodes to form an image,
   wherein the plurality of light emitting diodes is divided into a plurality of groups, at least two of the plurality of light emitting diodes being arranged in each of the plurality of groups, and the plurality of lenses respectively correspond to the plurality of groups, and
   wherein an interference prevention unit is disposed between the adjacent groups of the plurality of light emitting diodes, the interference prevention unit comprising a groove formed in the incident surface of the transparent substrate.

2. The light emitting diode array of claim 1, wherein the plurality of light emitting diodes are arranged in a row.

3. The light emitting diode array of claim 1, wherein the plurality of light emitting diodes are arranged in a plurality of rows.

4. The light emitting diode array of claim 3, wherein the plurality of light emitting diodes of the rows are arranged in a staggered pattern.

5. The light emitting diode array of claim 1, wherein the groups of the plurality of light emitting diodes are arranged at equivalent distances in a row.

6. The light emitting diode array of claim 5, wherein distance between the adjacent groups of the plurality of light emitting diodes is larger than distance between the adjacent light emitting diodes in each of the groups.

7. The light emitting diode array of claim 5, wherein the plurality of lenses are arranged in a row in the direction of the arrangement of the groups of the plurality of light emitting diodes.

8. The light emitting diode array of claim 1, wherein the plurality of the lenses of the plurality of light emitting diodes are arranged such that spots of light beams emitted from the plurality of light emitting diodes and formed as an image on an image plane are at equivalent distances in the direction of the arrangement of the plurality of light emitting diodes.

9. The light emitting diode array of claim 1, wherein the groove is filled with a light absorption material.

10. The light emitting diode array of claim 1, wherein a portion of the incident surface of the transparent substrate, except for a bonding area of the plurality of light emitting diodes, is covered with a reflection layer.

11. The light emitting diode array of claim 1, wherein the plurality of light emitting diodes comprise compound semiconductors that are grown on a growth substrate and separated from the growth substrate after being grown and that are bonded to the transparent substrate.

12. The light emitting diode array of claim 11, wherein each of the plurality of light emitting diodes comprises:
   a first conductivity compound semiconductor layer that is bonded to the transparent substrate;
   an active layer formed on the first conductivity compound semiconductor layer; and
   a second conductivity compound semiconductor layer formed on the active layer.

13. The light emitting diode array of claim 12, wherein each of the plurality of light emitting diodes comprises:
   a first electrode layer formed on a portion of the first conductivity compound semiconductor layer; and
   a second electrode layer formed on the second conductivity compound semiconductor layer,
   wherein the second electrode layer further covers a remaining portion of the first conductivity compound semiconductor layer except the portion where the first electrode layer is formed, and an insulation layer is provided beneath the second electrode layer except a portion where the second electrode layer contacts the second conductivity compound semiconductor layer.

14. The light emitting diode array of claim 12, wherein a reflection layer is disposed on the second conductivity compound semiconductor layer.

15. The light emitting diode array of claim 12, wherein each of the plurality of light emitting diodes has a truncated pyramid shape.

16. The light emitting diode array of claim 1, further comprising a wiring circuit formed on the incident surface of the transparent substrate, wherein the plurality of light emitting diodes are bonded to the wiring circuit by flip-chip bonding.

17. The light emitting diode array of claim 1, wherein the plurality of lenses are formed of a polymer layer by attaching the polymer layer to the transparent substrate and molding the polymer layer.

18. A light emitting diode array comprising:
   a transparent substrate comprising an incident surface and an exit surface;
   a plurality of light emitting diodes disposed on the incident surface of the transparent substrate; and
   a plurality of lenses that are disposed on the exit surface of the transparent substrate to magnify light emitted from the plurality of light emitting diodes to form an image,
   wherein the plurality of light emitting diodes is divided into a plurality of groups, at least two of the plurality of light emitting diodes being arranged in each of the plurality of groups, and the plurality of lenses respectively correspond to the plurality of groups, and
   wherein a surface of the transparent substrate is curved so that the plurality of lenses have refractive power.

19. A line printer head comprising a light emitting diode array emitting light to a photosensitive body in a main scanning direction, wherein the light emitting diode array comprises:
   a transparent substrate comprising an incident surface and an exit surface;
   a plurality of light emitting diodes disposed on the incident surface of the transparent substrate; and
   a plurality of lenses that are disposed on the exit surface of the transparent substrate to magnify light emitted from the plurality of light emitting diodes to form an image,
   wherein the plurality of light emitting diodes is divided into a plurality of groups, at least two of the plurality of light emitting diodes being arranged in each of the plurality of groups, and the plurality of lenses respectively correspond to the plurality of groups, and wherein a surface of the transparent substrate is curved so that the plurality of lenses have refractive power.

20. The line printer head of claim 19, wherein the plurality of light emitting diodes are arranged in a row or in a plurality of rows.

21. The line printer head of claim 19, wherein the plurality of the lenses and the plurality of light emitting diodes are arranged such that spots of light beams emitted from the plurality of light emitting diodes and formed as an image on an image plane are at equivalent distances.

22. The line printer head of claim 19, further comprising an interference prevention unit between adjacent groups of the plurality of light emitting diodes.

23. The line printer head of claim 19, wherein a portion of the incident surface of the transparent substrate except a bonding area of the plurality of light emitting diodes is covered with a reflection layer.

24. The line printer head of claim 19, wherein the plurality of light emitting diodes comprise compound semiconductors that are grown on a growth substrate and separated from the growth substrate after being grown and that are bonded to the transparent substrate.

25. The line printer head of claim 19, further comprising a wiring circuit on the incident surface of the transparent substrate, wherein the plurality of light emitting diodes are bonded to the wiring circuit by flip-chip bonding.

26. The line printer head of claim 19, wherein the plurality of lenses are formed of a polymer layer by attaching the polymer layer to the transparent substrate and molding the polymer layer.

27. An electrophotographic image forming apparatus comprising:

a photosensitive body;

a line printer head to scan light onto a scanning surface of the photosensitive body to form an electrostatic latent image, the line printer head comprising a light emitting diode array emitting light to the scanning surface of the photosensitive body in a main scanning direction; and a developing unit to supply toner to the electrostatic latent image formed on the photosensitive body to develop an image, wherein the light emitting diode array comprises a transparent substrate comprising an incident surface and an exit surface;

a plurality of light emitting diodes disposed on the incident surface of the transparent substrate; and a plurality of lenses that are disposed on the exit surface of the transparent substrate to magnify light emitted from the plurality of light emitting diodes to form the image, wherein the plurality of light emitting diodes is divided into a plurality of groups, at least two of the plurality of light emitting diodes being arranged in each of the plurality of groups, and the plurality of lenses respectively correspond to the plurality of groups, and wherein an interference prevention unit is disposed between the adjacent groups of the plurality of light emitting diodes, the interference prevention unit comprising a groove formed in the incident surface of the transparent substrate.

* * * * *